United States Patent [19]

Glennon

[11] Patent Number: 4,516,038

[45] Date of Patent: May 7, 1985

[54] TRIANGLE WAVE GENERATOR

[75] Inventor: Timothy F. Glennon, Rockford, Ill.

[73] Assignee: Sundstrand Corporation, Rockford, Ill.

[21] Appl. No.: 442,928

[22] Filed: Nov. 19, 1982

[51] Int. Cl.³ .......................... H03K 4/06; H03K 4/48
[52] U.S. Cl. ................................... 307/264; 307/228; 328/127; 328/173; 328/181
[58] Field of Search .................. 328/181, 150, 35, 132, 328/173, 168, 172; 307/228, 260, 261, 264, 271

[56] References Cited

U.S. PATENT DOCUMENTS

| | | | |
|---|---|---|---|
| 3,440,448 | 4/1969 | Dudley | 307/271 |
| 3,548,318 | 12/1970 | Yorksie | 307/228 |
| 3,577,007 | 5/1971 | Cross | 328/181 |
| 3,610,952 | 10/1971 | Chandos | 307/228 |
| 3,836,856 | 9/1974 | Lovadina et al. | 328/168 |
| 3,879,683 | 4/1975 | Bosselaers | 307/228 |
| 4,118,641 | 10/1978 | Lannuzel | 307/270 |
| 4,422,044 | 12/1983 | Mueller | 307/228 |

Primary Examiner—John S. Heyman
Assistant Examiner—Timothy P. Callahan
Attorney, Agent, or Firm—Harold A. Williamson; Ted E. Killingsworth; Michael B. McMurry

[57] ABSTRACT

This invention relates to a triangle wave generator for producing a constant amplitude triangle wave signal having a frequency proportional to an input voltage signal. The triangle wave generator is comprised of a square wave signal generating circuit to provide a square wave signal having a frequency proportional to the input voltage signal.

A biased amplifier circuit is provided which has an input and an output. The input of the biased amplifier circuit receives the input voltage signal and the biased amplifier output is coupled to a switching circuit.

The switching circuit is coupled to the square wave signal generating circuit to receive the square wave signal and provide a pair of square wave signals to positive and negative input terminals of a differential integrator. One of the pair of square wave signals is the complement of the other.

The differential integrator provides the constant amplitude triangle wave signal which has constant amplitude and has a frequency proportional to the input voltage.

12 Claims, 7 Drawing Figures

A.

B.

IF INTEGRATOR IS FIXED AND FREQUENCY DOUBLES

C.

THEN TRIANGULAR WAVE FREQUENCY DOUBLES BUT AMPLITUDE IS ONE HALF

D.

E.

F.

PWM OUTPUT-MODULATION FREQUENCY=f

G.

FREQUENCY DOUBLED AMPLITUDE HALVED

H.

PWM OUTPUT~MODULATION FREQUENCY= 2Xf

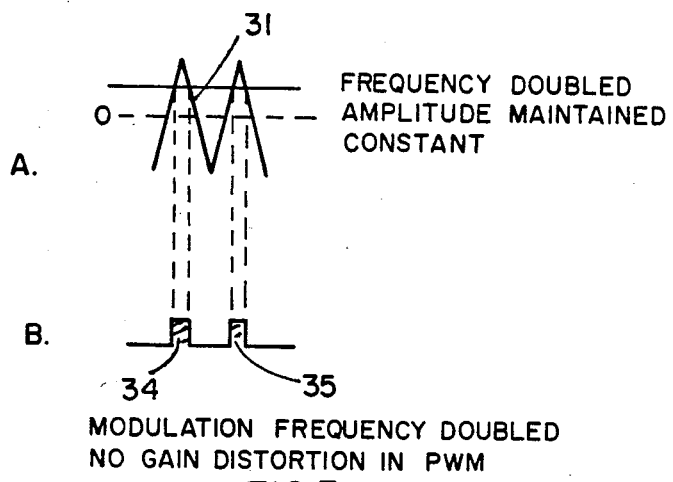
FIG.3
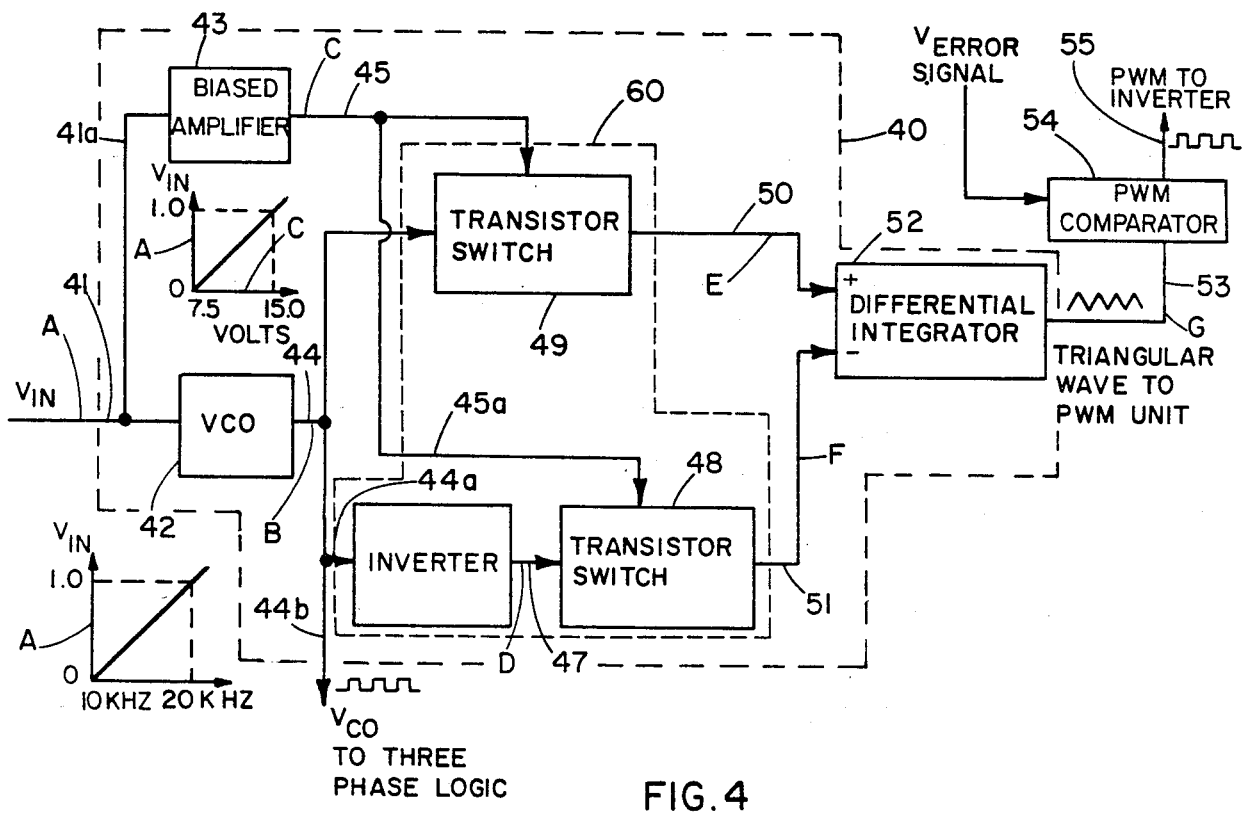
FIG.4
| | A∿V$_{IN}$ | C∿V$_{BIASED\ AMP.}$ | FREQUENCY |
|---|---|---|---|
| CASE NO.1 | 0 | 7.5 | 10 KHZ |
| CASE NO.2 | 1.0 | 15.0 | 20 KHZ |
FIG. 5

CASE NO. 1

A. $V_{IN}$  0 ——————————

B. VCO OUTPUT  +5V, 10K HZ

C. GAIN
$V_{IN} = 0$
C = 7.5
+7.5V ——————————

D. INVERTER  +5V

E. TRANSISTOR SWITCH OUTPUT  +7.5

F. TRANSISTOR SWITCH OUTPUT  +7.5

G. DIFFERENTIAL INTEGRATOR OUTPUT  +5, 0, −5    61

CASE NO. 2

A. $A \sim V_{IN}$  1.0 ——————————  0 — — — — — —

B. VCO OUTPUT  +5V, 20K HZ

C. GAIN
$V_{IN} = 1$
C = 15 V
+15.0V ——————————

D. INVERTER  +5V

E. TRANSISTOR SWITCH OUTPUT  +15
AREA "Y"

F. TRANSISTOR SWITCH OUTPUT  +15
AREA "Z"

G. DIFFERENTIAL INTEGRATOR OUTPUT  62  63  64  +5, 0, −5

TRIANGLE WAVE GENERATOR

TECHNICAL FIELD

This invention relates to a constant amplitude variable frequency triangle wave generator for use in a PWM motor control system.

BACKGROUND ART

To date there has not been a great deal of activity in high power inverter circuits employing high power transistors, capable of switching 1,250 amperes at 400 volts to provide AC power to variable speed motors 350 horsepower and larger. In order to handle these high levels of power there has been developed a drive circuit for parallel non-matched transistors which allows for non-matched transistors to be utilized without concern that the transistor will burn out because of inherently different on-times. The inventor of the invention to be described hereinafter, namely Timothy Glennon, in his U.S. Pat. No. 4,356,408 issued Oct. 26, 1982, which patent shares a common assignee with this application, solved the transistor burn out problem which has lead to what is believed to be to date the highest power density inverter motor ever demonstrated.

Until now, a power density of one (1) horsepower per pound had been attained. The invention to be described hereinafter forms in part an essential feature of what has been demonstrated as a PWM variable speed electric motor having a power density of 2 horsepower per pound. In prior art PWM motor controlled systems, the technique of using a voltage controlled oscillator to generate a frequency in response to a voltage level is well known. Normally, a square wave results. It is also well known that if a square wave is applied to an integrator, a triangle wave results. Typically a triangle wave generated in the fashion just described is utilized as the modulation source for the PWM motor control unit. In those environments where the voltage level, i.e., $V_{IN}$ are proportional to a motor speed commanded, and the motor speed is relatively constant, few problems arise. However, where the motor speed commanded, ranges from zero to a maximum speed to provide maximum horsepower, in for example, a torpedo propulsion system, the triangle wave amplitude has been found to decrease directly as frequency increased. Since the triangle wave amplitude is directly proportional to loop gain in a pulse width modulated (PWM) control system of the prior art, the loop gain varied directly with speed. This is highly undesirable, and this undesirable loop gain and its affect on the error control of the PWM will be described more fully hereinafter.

The invention to be described hereinafter produces a constant amplitude variable frequency triangle wave for use in a motor control PWM system.

There have been previous efforts to provide variable frequency triangle waves that have more or less constant amplitude. Typical of such efforts is that of Dudley in his U.S. Pat. No. 3,440,448 which illustrates a specific circuit for producing symetrical triangle waves in response to a variable voltage input. Dudley therefore appears to be the functional equivalent from an input-output viewpoint of the invention to be described hereinafter.

The Dudley waveform generator is directed to a circuit for producing a symetrical triangular waveform of variable repetition rate which includes an integrator circuit 9, 11 connected to receive the currents from a pair of current sources which are switched at set levels of amplitude of the generated triangular wave. The integrator circuit 9, 11 has an output coupled to a comparator. The repetition rate of the triangular waveform is varied by altering the amplitude of both current sources in a fixed ratio. The invention to be described hereinafter does not require a comparator connected to the output of the integrator to cause the current source on the input of the integrator to reverse. The invention of this specification uses an off the shelf voltage controlled oscillator (VCO) coupled with a differential integrator to produce the constant amplitude triangle wave, and further provides that the fundamental frequency be established by the VCO, and not by the triangle wave generated as in Dudley.

Another pertinent patent is that of Chandos U.S. Pat. No. 3,610,952, which patent is directed to a device for automatically converting a square wave input signal into a constant amplitude triangular wave output signal regardless of changes in the amplitude or frequency of the input square wave signal. Chandos accomplishes this by providing a variable resistance device to receive a square wave input signal and transfer an input signal to a fast integrator circuit which converts the square wave signal into an integrator output triangular wave signal. A buffer stage removes any DC component from the integrator output triangular wave signal and buffers it into a triangular wave output signal. A signal-clipping means that may comprise a zener diode connected to the output of the buffer applied a clipped portion of the triangular wave output signal, together with a bias signal, to a slow integrator circuit. The slow integrator circuit signal, comprising a control signal, is responsive to the voltage differences between the zener diode-clipped signal and the fixed (but controllable) bias signal. The slow integrator output is coupled to control the variable resistance device in order to increase or decrease the time constant of the fast integrator circuit which varies the amplitude of the integrator output triangular wave signal and thereby maintains the triangular wave output signal at a constant amplitude.

The invention to be described in the specification hereinafter accomplishes similar goals as Chandos, but with a consumately simpler circuit arrangement which does not require such circuit components as "variable resistance means, fast integrator, slow integrator, etc".

DISCLOSURE OF THE INVENTION

More specifically, this invention relates to a triangle wave generator for producing a constant amplitude triangle wave signal having a frequency proportional to an input voltage signal. The triangle wave generator is comprised of a square wave signal generating circuit to provide a square wave signal having a frequency proportional to the input voltage signal.

A biased amplifier circuit is provided which has an input and an output. The input of the biased amplifier circuit receives the input voltage signal and the biased amplifier output is coupled to a switching circuit.

The switching circuit is coupled to the square wave signal generating circuit to receive the square wave signal and provide a pair of square wave signals to positive and negative input terminals of a differential integrator. One of the pair of square wave signals is the complement of the other.

The differential integrator provides the constant amplitude triangle wave signal which has constant amplitude and has a frequency proportional to the input voltage.

It is therefore a primary object of this invention to provide a triangle wave generator which utilizes in combination a biased amplifier circuit, a square wave generator, a switching circuit and a differential integrator to provide a constant amplitude triangle wave signal which has constant amplitude and is proportional to input voltage delivered to the biased amplifier circuit and the square wave generator.

Another object of the invention is to provide a triangle wave generator that employs an off the shelf voltage controlled oscillator (VCO) in combination with a transistor switch arrangement, that provides an operational amplifier connected to form a differential integrator, with a pair of square wave signals, one of which is the compliment of the other to thereby provide at the differential integrator output a constant amplitude triangle wave signal which signal is proportional to an input voltage delivered to the VCO.

A final object of the invention is to provide a circuit arrangement for use in a PWM motor control that will allow the motor to experience a constant volt second per cycle voltage control and for the motor to be responsive to a variable speed control input signal.

In the attainment of the foregoing objects, the invention contemplates a triangle wave generator for producing a constant amplitude triangle wave signal which has a frequency proportional to an input voltage signal. The triangle wave generator includes in combination, a voltage controlled oscillator (VCO) to provide a square wave signal that has a frequency proportional to the input voltage signal. First and second transistor switching circuits are each coupled to the VCO to receive the square wave signal.

A biased amplifier circuit is provided that has an input and an output. The biased amplifier input receives the input voltage signal and the output is coupled respectively to the first and second transistor switches. The biased amplifier is designed to provide a predetermined output when the input to it is zero. The final component of the combination is an operational amplifier connected to form a differential integrator that has positive and negative input terminals.

The first transistor switching circuit provides a square wave signal to the positive terminal of said differential integrator. The second transistor switching circuit provides a square wave signal, which is the complement of the square wave from the first transistor switching circuit to be delivered to the negative terminal of the differential integrator.

Finally, the differential integrator provides the triangular waveform signal that is of constant amplitude and has a frequency which is proportional to the input voltage.

Other objects and advantages of the present invention will be apparent upon reference to the accompanying description when taken in conjunction with the following drawings.

BRIEF DESCRIPTION OF THE DRAWINGS

FIG. 3 is a waveform timing chart of a desired triangle waveform and associated PWM signal that result from the invention, FIG. 4 is a block diagram of the circuit embodying the invention, FIG. 5 is a chart of two sets of operating conditions.

BEST MODE FOR CARRYING OUT THE INVENTION

Figure 1:
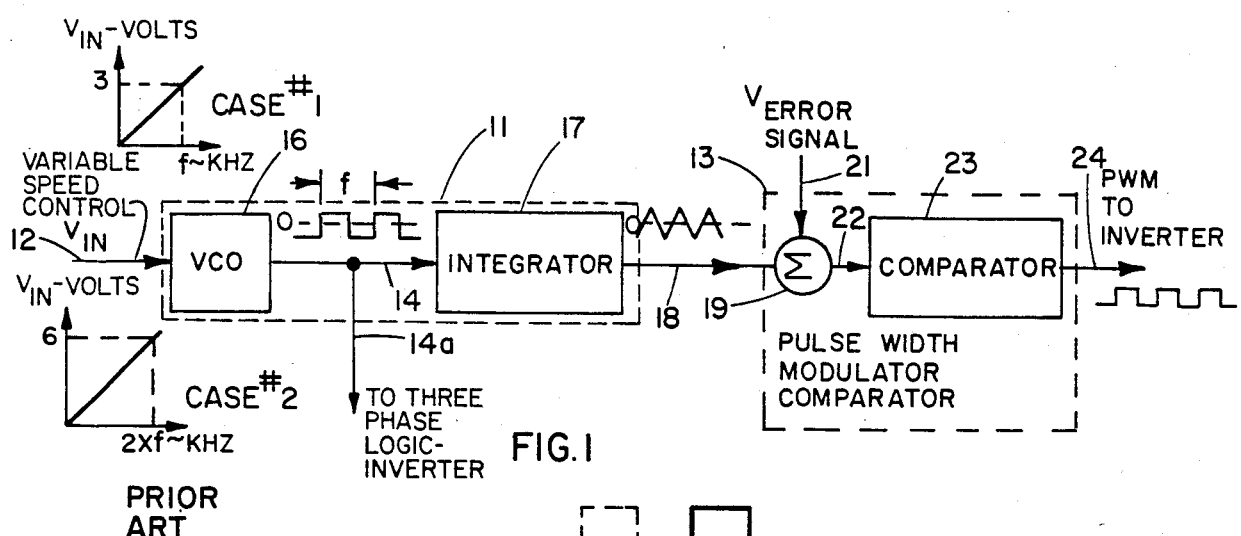
FIG. 1 is a block diagram illustrating a prior art, square wave and triangle wave signal generator in combination with a pulse width modulation comparator, FIG. 2 in lines A to H depict a waveform timing chart in respect of FIG. 1.

Reference is now made to FIG. 1 which is a block diagram of a prior art circuit arrangement in which the problem solved by the invention of this application is depicted. In FIG. 1 there will be seen that the circuit contains two major components, both of which are shown in dotted outline. The first component is designated a signal generator 11, and the second component is designated a PWM comparator 13. The entire circuit arrangement has a DC voltage $V_{IN}$ on lead 12, and a PWM pulse train output on lead 24. The signal generator 11 includes a voltage controlled oscillator (VCO) 16, which has an output on lead 14 to an integrator 17. The VCO 16 operates in a wholly conventional fashion by delivering on its output lead 14 a square wave pulse train which is depicted just above lead 14. The square wave pulse train is also present on lead 14a and typically the square wave pulse train on lead 14a is delivered to a three phase logic circuit associated with an inverter to develop the motor frequency. The integrator 17, which was a conventional operational amplifier, changes the square wave pulse train into a triangular pulse wave train as shown above output lead 18.

In order to appreciate the problem to which the invention of this specification provides a solution, the circuit arrangement of FIG. 1 and its operation will be described under two different sets of operating conditions. These operating conditions will be referred to in respect of FIG. 1 as Case No. 1 and Case No. 2. To the left of the signal generator 11 there is illustrated a transfer function for the VCO 16 and Case No. 1. Beneath Case No. 1 the graphic representation of a transfer function for Case No. 2 is illustrated. Studying the transfer functions just referred to, it will be noted that in Case No. 1 if, hypothetically, $V_{IN}$ is 3 volts, then the VCO output will have a 10 KHz output. In Case No. 2, when the voltage is doubled to 6 volts for $V_{IN}$, then the frequency of the VCO output is doubled to 20 KHz.

Figure 2:
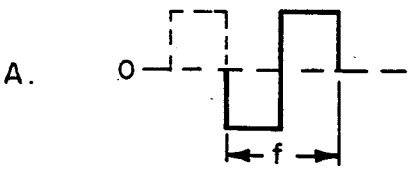
Figure 2:
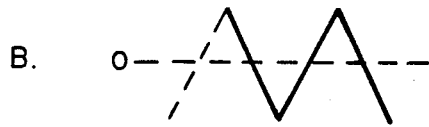
Figure 2:
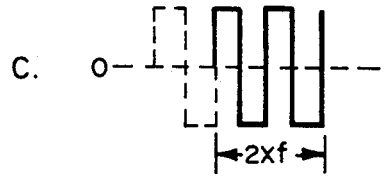
Figure 2:
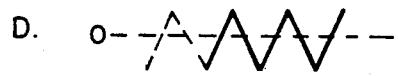
Figure 2:
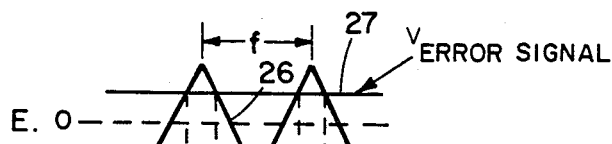
Figure 2:
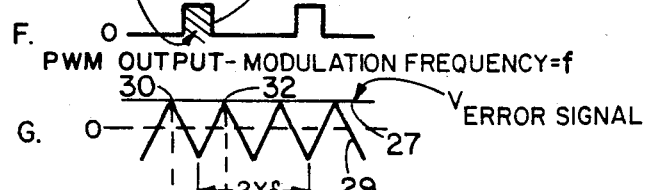

In FIG. 2 lines A and B illustrate the wholly conventional outputs of the VCO 16, and the integrated square wave of line A which forms the triangular shaped wave form of line B which appears on lead 18 from the integrator 17. In FIG. 2, at lines C and D, there is evidenced the square waveform and the triangular wave form that results from a doubling of $V_{IN}$ which results in a doubling of the frequency of both the square wave on lead 14, and the triangular wave on lead 18. It is of special significance to note that the doubling of the frequency of the square wave inherently reduces by one-half the amplitude of the triangular waveform as is shown on line D. The significance of the amplitude reduction by one-half, and the problems attendant with the amplitude reduction will be explained with respect to the operation of the pulse width modulator comparator 13.

The pulse width modulator comparator 13 conventionally includes a signal summing circuit 19 which receives the triangular waveform signal present on lead 18. The signal summing circuit 19 typically is provided with an error signal input on lead 21, which may be a volt-second/cycle error signal received from an error signal generating circuit (not shown) that is coupled to a motor (also not shown) to receive a motor voltage feedback signal and a speed command signal.

Attention is now direction to FIG. 2, line E, where a triangle waveform signal 26 representing the integrator 17 output in a Case No. 1 situation. In FIG. 2, line E, there is also shown the error signal voltage 27 which would be present on lead 21 to the signal summing circuit 19. The comparator circuit 23 in a wholly conventional fashion receives the output from the signal summing circuit 19 on lead 22, and provides the PWM square wave signal output on lead 24. The lead 24 and the PWM signal thereon is typically delivered to the previously noted three phase logic circuit associated with an inverter, both of which are not shown, as noted earlier. Line F of FIG. 2 depicts the PWM signal 28 which appears on lead 24 to control motor operation.

The problem to which the invention of this specification lends itself to solving arises when the input speed command for the motor calls for a doubling of the speed of the motor over the Case No. 1 condition. Case No. 2 would result in $V_{IN}$ being doubled to 6 volts with the attendant VCO 16 output frequency doubling which results in the triangle waveform amplitude decreasing by one-half. At line G, there is shown a triangle waveform 29 of the same configuration as line D, FIG. 2. Also shown in line G of FIG. 2 is the error signal line 27 described above in respect of condition No. 1. The electrical signal situation depicted on line G of FIG. 2 has purposely been selected to dramatize the effective gain change or loss of the error signal 27 utility when the frequency of the triangle wave 29 is doubled. Accordingly, when line G of FIG. 2 is viewed it will be observed that the error signal line 27 just touches the peaks 30, 32 of the triangle curve 29. When the condition just described is present in the signal summing circuit 19, the PWM output signal that would be present on lead 24 would be that of line H, FIG. 2, namely, an output that would provide no error correction information.

The invention to be described, completely solves this problem by providing as is shown in FIG. 3, line A, a triangle waveform signal 31 which has the same doubled frequency as triangle wave signal 29, line G, FIG. 2, but with an amplitude that remains equal to triangle waveform signal 26, line E, FIG. 2. When the invention to be described is utilized, the area under the curve 28 designated by reference numeral 33 is equal to the sum of the areas 34, 35 of the PWM output of line B, FIG. 3, which is desirable in view of the frequency doubling.

Reference is now made to FIG. 4 which illustrates the preferred embodiment of the invention. There is shown in FIG. 4 a signal generator 40 which will take the place of the signal generator 11 in the environment described in respect to FIG. 1. It will be noted that the signal generator 40 is provided with inputs and outputs that correspond to the inputs and outputs of the signal generator 11 of FIG. 1. Accordingly, a variable speed control signal represented by $V_{IN}$ is present on lead 41. A square wave output to the three phase logic associated with an inverter is present on lead 44b, while a triangle wave output is present on output lead 53. A pulse width modulator comparator 54 which corresponds to the PWM comparator 13 of FIG. 1 is also depicted. The PWM comparator 54 has a PWM waveform signal present on lead 55. The signal generator 40 has a circuit network thereof which provides for triangular wave generation. This circuit network of the signal generator 40 that produces the triangular wave is designated a triangular wave generator and from the description that follows it will be seen that the triangular wave generator produces a constant amplitude triangular wave signal which has a frequency proportional to an input voltage signal. The triangular wave generator includes a voltage controlled oscillator 42 which receives a variable speed signal in the form of a variable DC voltage input signal $V_{IN}$ which is present on lead 41 to VCO 42. The VCO 42 is typically an off the shelf unit that produces a square wave signal on lead 44. The square wave signal on lead 44 has a frequency proportional to the input voltage signal $V_{IN}$.

In the description that follows, an understanding of the contribution being described will be enhanced by an awareness that the signal waveforms present in the circuit at any given instant are reflected in the waveform timing charts of FIG. 6 and FIG. 7 for what will be described hereinafter as Case No. 1 and Case No. 2. Accordingly, in FIG. 6 it will be noted that there has been designated lines A thru G, and in FIG. 4 the waveform, for example, on lead 41 which is designated by the reference character A is that waveform shown in line A of FIG. 6. A visual review of the balance of the circuit illustrated in FIG. 4 will reveal the balance of the remaining reference characters, and upon reference to FIGS. 6 and 7, one may instantaneously determine the waveform configuration present on each and every electrical lead, depending upon the mode of operation, whether it be Case No. 1 or Case No. 2 to be described more fully hereinafter.

Returning to FIG. 4, it will be seen that the square wave output from the VCO 42 on lead 44 is simultaneously delivered to a transistor switch 49 via lead 44 and inverter 46 via leads 44, 44a, and to the three phase logic as indicated in FIG. 4 via leads 44, 44b. The inverter 46 delivers the inverted square waveform signal generated by the VCO 42 via lead 47 to a transistor switch 48. Transistor switches 49 and 48 are coupled via a pair of outputs present on leads 50 and 51 to the positive and negative terminals of a differential integrator 52. The inverter 46, transistor switch 48 and transistor switch 49 comprise what will, from time to time hereinafter be referred to as switching circuits or switching means. A biased amplifier 43 is shown electrically connected via 41a to lead 41 and through this connection the biased amplifier 43 receives the $V_{IN}$ variable voltage signal. The biased amplifier 43 is connected respectively to transistor switches 48 and 49 via electrical leads 45, 45a. The differential integrator 52 provides on lead 53 the constant amplitude transistor wave signal which has a frequency proportional to the input voltage signal $V_{IN}$. The differential integrator is simply an operational amplifier connected to form a differential integrator and its details are therefore not shown, as differential integrators of this type are conventional.

Reference is now made to FIG. 5 which illustrates a chart which will be, upon examination, self-explanatory. The chart covers what is termed Case No. 1 and Case No. 2, and indicates that at point A in the circuit when the $V_{IN}$ is zero and a biased amplifier 43 provides at point C on lead 45 a voltage level of 7.5 volts. The VCO 42 responds as will be evident from a study of the transfer function illustrated beneath the VCO 42 in FIG. 4. Accordingly, when $V_{IN}$ is zero, the frequency of the square wave leaving the VCO 42 has a 10 KHz frequency. In Case No. 2, when the $V_{IN}$ is one volt, the voltage out of the biased amplifier 42 is doubled from 7.5 volts to 15 volts, while the frequency of the square wave signal on lead 44 from the VCO 42 is doubled from 10 KHz to 20 KHz.

Figure 6:
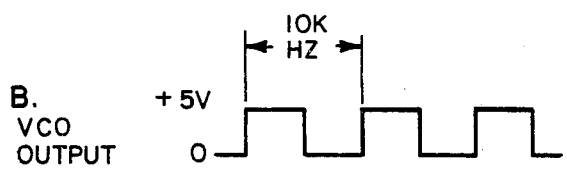
FIG. 6 is a waveform timing chart depicting circuit waveform conditions in a Case No. 1 operating situation as depicted in FIG. 5.
Figure 6:
Figure 6:
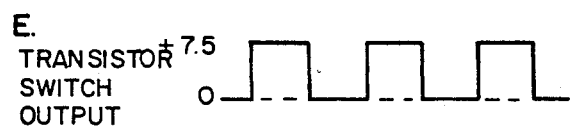
Figure 6:
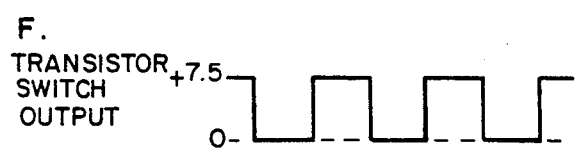
Figure 6:
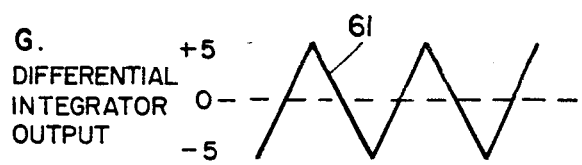
Figure 7:
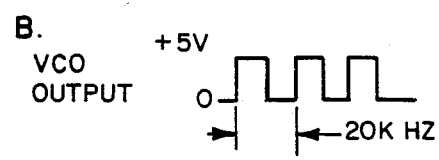
FIG. 7 is a waveform timing chart depicting circuit waveform conditions in Case No. 2.
Figure 7:
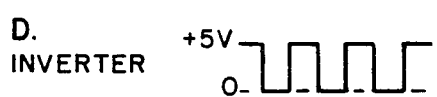
Figure 7:
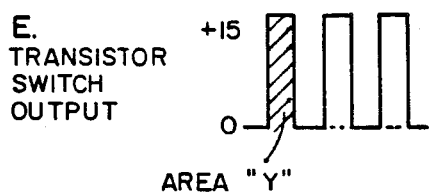
Figure 7:
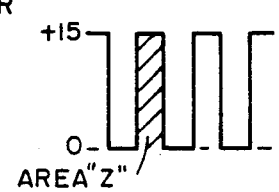
Figure 7:
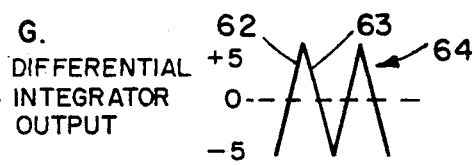

FIG. 6 and FIG. 7 as noted earlier are directed to waveform timing charts and illustrate in the case of FIG. 4 the condition of the various waveform signals as they dynamically appear through the circuit containing the invention. FIG. 6 is self-explanatory in that in lines A through G of FIG. 6, the waveforms generated are illustrated and result in line G showing a differential integrator output curve 61 which appears on lead 53. The reader is invited now to study and compare the waveform transitions that transpire when the circuit arrangement of FIG. 4 experiences the situation defined above as Case No. 2, namely that situation when the $V_{IN}$ goes from zero to one volt with the attendant doubling of the frequency of the square wave signal on lead 44 from the VCO 42, which frequency doubling is the same as that discussed in respect of the prior art in FIG. 1. It can be appreciated that the switching means or circuit 60 which is coupled to the VCO 42 as described, provides a pair of square wave signals as indicated in FIG. 7 on lines E and F, respectively on leads 50 and 51. The signals shown on lines E and F of FIG. 7 are delivered respectively to a positive and negative terminal of the differential integrator 52. The differential integrator 52 integrates the area Y shown in line E of FIG. 7 which generates the positive going side 62 of the triangle wave 64 shown at line G of FIG. 7. Integration of the area designated Z as shown in FIG. 7 at line F results in the negative going side 63 of the triangle waveform signal 64 as it is shown in FIG. 7, line G. It should be readily appreciated that the desired constant amplitude triangle waveform signal 64 which arises as a consequence of the invention described is exactly that which was described in respect of FIG. 3 and the triangle waveform 31. The triangle waveform signal 64 has a frequency which is proportional to input voltage.

Although this ivention has been illustrated and described in connection with the particular embodiment illustrated, it will be apparent to those skilled in the art that various changes may be made therein without departing from the spirit of the invention as set forth in the appended claims.

I claim:

1. A triangle wave generator for producing a constant amplitude triangle wave signal having a frequency proportional to an input voltage signal, said triangle wave generator comprising,
    a square wave signal generating means to provide a square wave signal having a frequency proportional to said input voltage signal,
    biased amplifier means having an input and an output, said input receiving said input voltage signal and said output coupled to a switching means,
    said switching means coupled to said square wave signal generating means to receive said square wave signal and provide a pair of square wave signals to a positive and negative input terminal of a differential integrator, one of said pair of signals being the complemet of the other,
    said differential integrator providing said constant amplitude triangle wave signal having constant amplitude and being proportional to said input voltage.

2. The triangle wave generator of claim 1 wherein said square wave signal generating means is a voltage controlled oscillator.

3. The triangle wave generator of claim 2 wherein said biased amplifier has a predetermined output when said input voltage is zero.

4. The triangle wave generator of claim 3 wherein said switching means includes first and second switching means each coupled to said voltage controlled oscillator to receive said square wave signal.

5. The triangle wave generator of claim 4 wherein said first and second switching means are transistor type switches.

6. The triangle wave generator of claim 5 wherein there is included an inverter means coupled between said voltage controlled oscillator and said second transistor switch to thereby provide from said second transistor switch said square wave signal of said one of said pair of signals which is the compliment of said square wave signal from said voltage controlled oscillator.

7. The triangle wave generator of claim 6 wherein said differential integrator is an operational amplifier connected to form a differential integrator.

8. A triangle wave generator for producing a constant amplitude triangle wave signal having a frequency proportional to an input voltage signal, said triangle wave generator comprising,
    a square wave signal generating means to provide a square wave signal having a frequency proportional to said input voltage signal,
    first and second switching means each coupled to said square wave signal generating means to receive said square wave signal,
    biased amplifier means having an input and an output, said input receiving said input voltage signal and said output coupled respectively to said first and second switching means.
    an operational amplifier connected to form a differential integrator having positive and negative input terminals,
    said first switching means providing a square wave signal to said positive terminal of said differential integrator and said second switching means providing a square wave signal, which is the complement of said square wave, to said negative terminal of said differential integrator,
    said differential integrator providing said constant amplitude triangular signal that is of constant amplitude and has a frequency proportional to said input voltage.

9. The triangle wave generator of claim 8 wherein said square wave signal generating means is a voltage controlled oscillator.

10. The triangle wave generator of claim 9 wherein said first and second switching means use transistor type switches.

11. The triangle wave generator of claim 10 wherein there is included an inverter means coupled between said voltage controlled oscillator and said second transistor switch to thereby provide from said second transistor switch said square wave signal which is a compliment of said square wave signal from said voltage controlled oscillator.

12. The triangle wave generator of claim 11 wherein said biased amplifier means has a predetermined output when said input voltage is zero.

* * * * *